United States Patent
van der Zanden et al.

(10) Patent No.: US 9,413,308 B2
(45) Date of Patent: Aug. 9, 2016

(54) RF POWER DEVICE

(71) Applicant: Ampleon Netherlands B.V., Nijmegen (NL)

(72) Inventors: Josephus van der Zanden, Best (NL); Vittorio Cuoco, Nijmegen (NL); Rob Mathijs Heeres, Nijmegen (NL)

(73) Assignee: Ampleon Netherlands B.V., Nijmegen (NL)

(*) Notice: Subject to any disclaimer, the term of this patent is extended or adjusted under 35 U.S.C. 154(b) by 0 days.

(21) Appl. No.: 14/317,030

(22) Filed: Jun. 27, 2014

(65) Prior Publication Data
US 2015/0028955 A1 Jan. 29, 2015

(30) Foreign Application Priority Data
Jul. 25, 2013 (EP) .................................. 13178065

(51) Int. Cl.
| | | |
|---|---|---|
| H03F 3/04 | (2006.01) | |
| H03F 3/193 | (2006.01) | |
| H03F 3/24 | (2006.01) | |
| H03F 3/213 | (2006.01) | |
| H01L 23/66 | (2006.01) | |
| H03F 1/56 | (2006.01) | |
| H01L 23/64 | (2006.01) | |

(52) U.S. Cl.
CPC ............. *H03F 3/193* (2013.01); *H01L 23/66* (2013.01); *H03F 1/56* (2013.01); *H03F 3/213* (2013.01); *H03F 3/245* (2013.01); *H01L 23/642* (2013.01); *H01L 2223/6611* (2013.01); *H01L 2223/6655* (2013.01); *H01L 2224/48091* (2013.01); *H01L 2224/48137* (2013.01); *H01L 2224/49109* (2013.01); *H01L 2224/49175* (2013.01); *H01L 2924/3011* (2013.01); *H01L 2924/30111* (2013.01); *H03F 2200/255* (2013.01); *H03F 2200/423* (2013.01); *H03F 2200/451* (2013.01)

(58) Field of Classification Search
CPC ........................................................ H03F 3/04
USPC .................................................. 330/302, 307
See application file for complete search history.

(56) References Cited

U.S. PATENT DOCUMENTS

| | | | |
|---|---|---|---|
| 4,393,392 A | 7/1983 | Hale | |
| 2002/0134993 A1 | 9/2002 | Leighton et al. | |
| 2002/0149428 A1* | 10/2002 | Toncich | ............. G01R 27/2694 330/302 |
| 2004/0061214 A1* | 4/2004 | Crescenzi, Jr. | .......... H01L 23/66 257/691 |

(Continued)

FOREIGN PATENT DOCUMENTS

JP 2003 115732 A 4/2003

OTHER PUBLICATIONS

Extended European Search Report for Application No. 13178065.2 (Jan. 31, 2014).

*Primary Examiner* — Patricia T Nguyen
(74) *Attorney, Agent, or Firm* — McDonnell Boehnen Hulbert and Berghoff LLP

(57) ABSTRACT

In RF power transistors, the current distribution along edges of the transistor die may be uneven leading to a loss in efficiency and in the output power obtained, resulting in degradation in performance. When multiple parallel dies are placed in a package, distribution effects along the vertical dimension of the dies are more pronounced. A RF power device (600) for amplifying RF signals is disclosed which modifies the impedance of a portion of the respective one of the input lead and the output lead and redistributes the current flow at an edge of the transistor die.

14 Claims, 9 Drawing Sheets

(56) References Cited

U.S. PATENT DOCUMENTS

| | | | |
|---|---|---|---|
| 2007/0024374 A1* | 2/2007 | Blair | H01L 23/66 330/302 |
| 2008/0315392 A1* | 12/2008 | Farrell | H01L 23/66 257/691 |
| 2010/0188164 A1* | 7/2010 | Blednov | H01L 23/66 333/109 |
| 2011/0221033 A1* | 9/2011 | Boulay | H01L 24/49 257/531 |
| 2013/0015924 A1* | 1/2013 | Andre | H01L 23/642 333/32 |

* cited by examiner (a)

(b)

RF POWER DEVICE

CROSS-REFERENCE TO RELATED APPLICATIONS

This application claims the priority under 35 U.S.C. §119 of European patent application no. 13178065.2, filed on Jul. 25, 2013, the contents of which are incorporated by reference herein.

The invention relates to Radio frequency (RF) power devices for amplifying RF signals.

Power transistors capable of amplifying RF signals are used for example in base stations in communication networks. These transistors may be, for example LDMOS and HEMT transistors implemented in a number of technologies, for example Silicon LDMOST and Gallium Nitride HEMT. To obtain the necessary price and performance, multiple active parallel transistors may be packaged together in a single package together with impedance matching networks in order to save costs while obtaining the required power levels.

The current distribution along edges of transistor dies may be uneven leading to a loss in efficiency and in the output power obtained, resulting in degradation of performance. When multiple connected parallel dies are placed in a package, distribution effects along the vertical dimension of the dies are more pronounced. The efficiency loss can be as much as 5% and the loss in output power can be as much as 15%. This is a very significant decrease considering that for example in LDMOS RF Power transistors each new generation of device, only brings about 2% improvement in efficiency and 10% increase in output power.

FIG. 1 shows a typical RF power device configuration 100 in plan view in FIG. 1a and in cross-section in FIG. 1b. The RF power device 100 is shown on FIG. 1a mounted on a printed circuit board 10 which may have a recessed portion 12. The flange 14 may form a conductive substrate. During the packaging process an insulating ring frame 16 may be fixed on top of the flange 14. An input lead 20 and an output lead 18 may be positioned partially on the insulating ring frame 16. The input lead 20 and output lead 18 may be separated from the flange by the insulating ring frame 16. Hence portions of the insulating ring frame 16 form insulating regions. An active die 24 which may contain at least one power transistor and a second active die 24' which may be identical to the first active die 24 may be positioned on the flange 14 between the input lead 20 and the output lead 18. A second active die 24' which may be identical to the first active die 24 may be positioned on the flange 14 between the input lead 20 and the output lead 18. A passive input die 22 including a matching capacitor and a second passive input die 22' may be positioned on the flange 14 between the input lead and the first active die 24 and the second active die 24'. A passive output die 26 including a matching capacitor 26 and a second passive output die 26' may be positioned on the flange 14 between the active dies 24, 24' and the output lead 18. The power transistors on the active dies may be electrically connected in parallel to effectively form one large transistor. The input lead 20 may be connected to gates of the power transistors present on the active die 24 and the second active die 24' by bond wires 28. The output lead 18 may be connected to drains of the power transistors present on the active die 24 and the second active die 24'. The sources of the power transistors present on the active die 24 and the second active die 24' may be connected to the flange 14. A first electrode of input matching capacitor 22 may be connected to the input lead 20 by bond-wires 28. A second electrode of input matching capacitor 22 may be connected to the flange 14. A first electrode of output matching capacitor 26 may be connected to the drains of RF power transistors on active die 24 by bond-wires 28. A second electrode of output match capacitor 25 may be connected to flange 14. The input and output matching capacitors on the respective passive dies together with the bond-wires may be used to match the respective input and output impedances to improve the overall performance of the RF power device. The passive die and bond-wires may form an input matching network and output matching network respectively. Alternatively, the skilled person will appreciate that other impedance elements such as resistors and inductors may be used instead of or in combination with capacitors to form input and output matching networks.

The active die 24 and passive die 26 in the RF power device 100 may be is sealed with a lid or cap which is not shown. The insulting ring frame 16 and the lid or cap may be made of ceramic or plastic material.

The active and passive dies and the bond-wires may be in an air cavity of the packaged RF device 100. Alternatively after the dies are attached and the bond-wires placed, plastic can be molded using over molded plastic (OMP) processes.

The flange 14 may act as ground for the RF power device 100 and may be placed on a heat sink which also may act as common ground for the RF Power device and the printed circuit board 10. The printed circuit board 10 is not part of the RF power device and may typically be used for impedance matching purposes. The recessed portion 12 of the printed circuit board may be patterned around the shape of the RF power device 100.

FIG. 2a shows the current distribution 200 in the RF power device 100 along the active die 24, the output matching capacitor 26, and portion of the output lead 18. The darker areas indicate higher levels of current. There is a significant variation in current distribution along the edge of active die 24, which corresponds to the variation of drain current of the power transistors. For example the current flowing out of the device at point A indicated in FIG. 2 is larger than the current at point B. This is occurring despite the fact that the geometry of the RF power transistor is a perfectly symmetrical and also the package is symmetrical.

FIG. 2b shows a graph 300 of the variation of the real part of the impedance against the position along the active die. Graph line 30 shows the variation along an edge of active die 24 corresponding to the output, and graph line 32 shoes the variation along an edge active die 24' corresponding to the output. This shows that there is a significant variation of impedance along the edge of the active dies despite the structure being symmetrical.

FIG. 3a shows the current distribution 400 for an RF power device having only one active die 24. The structure of the device is similar to that shown in FIG. 1 except for the fact that there is only one active die 24 one input matching capacitor 22 and one output matching capacitor 26. There is still a variation in current, for example between point C and point D, although not as large as the situation where the RF power device has two dies. FIG. 3b shows a graph 500 of the variation of the real part of the impedance versus the positioned along the die. Again there is a variation, although this is not as significant as for the case where there are two or more die in a package.

Various aspects of the invention are defined in the accompanying claims. In a first aspect there is described RF power device for amplifying RF signals comprising a flange, an input lead, an output lead, wherein the input lead and output lead are separated from the flange by an insulating region, an input matching network comprising an input matching die having a first terminal coupled to the input lead by a plurality of bond-wires and a second terminal coupled to the flange, an output matching network comprising an output matching die having a first terminal coupled to the output lead by a plurality of bond-wires and a second terminal coupled to the flange, an active die mounted on the flange, the active die comprising at least one power transistor, at least one input terminal and at least one output terminal respectively coupled to the input lead and the output lead by a plurality of bond-wires and at least one capacitance element connected to one of the input lead and the output lead and wherein in operation the at least one capacitance element modifies the impedance of a portion of the respective one of the input lead and the output lead and redistributes the current flow at an edge of the at least one active die.

The at least one capacitance element provides a lumped impedance in specific places on the leads which locally modifies the impedance, thus leading to a modification of the current distribution. By using one or more capacitance elements and optimizing the position and the values, the current flow at an edge of at least one of the active dies may be redistributed which may improve the efficiency of the RF power device. The at least one capacitance element may be connected to either of input or output side of the packaged amplifier or both sides and can be realised with either lumped capacitor or with a bond-wire connecting to a capacitor.

In embodiments the input lead and output lead may at least partially overlap the flange and the at least one capacitance element comprises a conductive pillar partially spanning a gap between the flange and a surface of one of the input lead and the output lead.

The capacitance element can be formed by an arrangement of a conductive pillar or rod between one of the leads and the conductive substrate. The remaining gap forms the dielectric layer of the capacitance and the conductive pillar, lead and the conductive substrate form the two electrodes to locally modify the impedance of the lead.

In embodiments the conductive pillar may be in contact with at least one of the input lead and the output lead.

In embodiments the conductive pillar may be formed from a part of one of the input lead and the output lead.

The pillar can be formed as part of the lead during the packaging and assembly process. The length of the pillar can be altered according to the characteristics of the packaged RF devices. No additional discrete capacitors are required.

In embodiments of the RF power device the conductive pillar may be in contact with the conductive substrate and extends towards a surface of the input lead and the output lead.

In embodiments the at least one capacitive element may comprise a discrete MOS capacitor.

In embodiments the discrete MOS capacitor may be connected to one of the input lead and the output lead by a single bond wire.

In embodiments of the RF power device the discrete MOS capacitor may be connected to the input lead by a first bond wire between the discrete MOS capacitor and input matching passive die and a second bond wire between the input matching passive die and the input lead.

In embodiments of the RF power device the discrete MOS capacitor may be connected to the output lead by a first bond wire between the discrete MOS capacitor and output matching passive die and a second bond wire between the output matching passive die and the output lead.

In embodiments of the RF power device the at least one capacitive element may be formed on the input matching passive die.

In embodiments the at least one capacitive element may be formed on the output matching die.

In embodiments the at least one capacitive element may be formed on the active die.

In embodiments, the RF power device may comprise a further input matching network comprising a further input matching die having a first terminal coupled to the input lead by a plurality of bond-wires and a second terminal coupled to the flange, a further output matching network comprising a further output matching die having a first terminal coupled to the output lead by a plurality of bond-wires and a second terminal coupled to the flange, a further active die mounted on the flange, the further active die comprising at least one power transistor, at least one input terminal and at least one output terminal respectively coupled to the input lead and the output lead by a plurality of bond-wires; wherein the at least one capacitance element modifies the current distribution along an edge of the active die and the further active die.

In embodiments the RF power transistors may be LDMOS or HEMT transistors.

Embodiments of the RF power device may be included in RF power amplifiers and base stations.

Embodiments of the invention are now described in detail, by way of example only, illustrated by the accompanying drawings in which.

Figure 1:
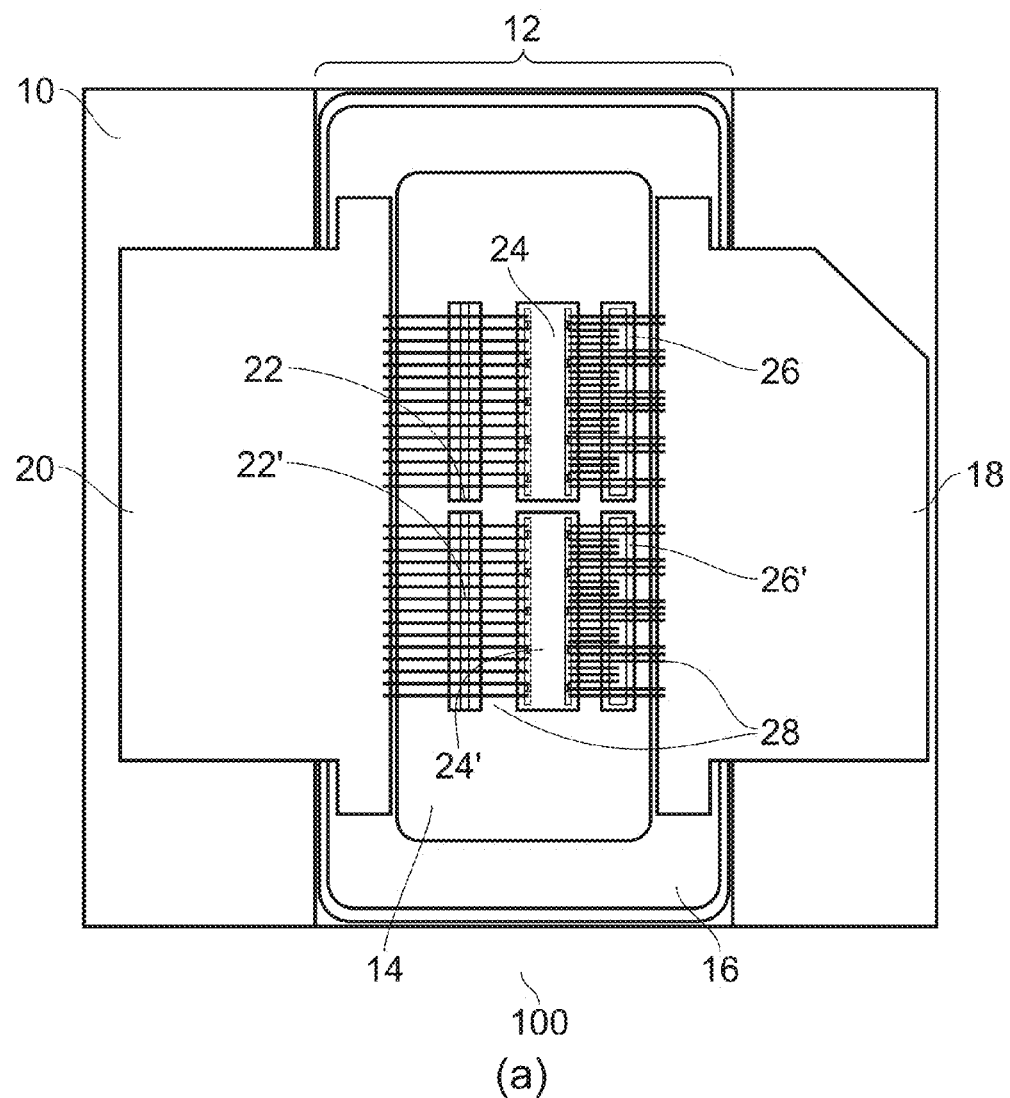
FIG. 1 illustrates a known RF power device configuration comprising two active dies in a) plan view and b) cross-section.
Figure 1:
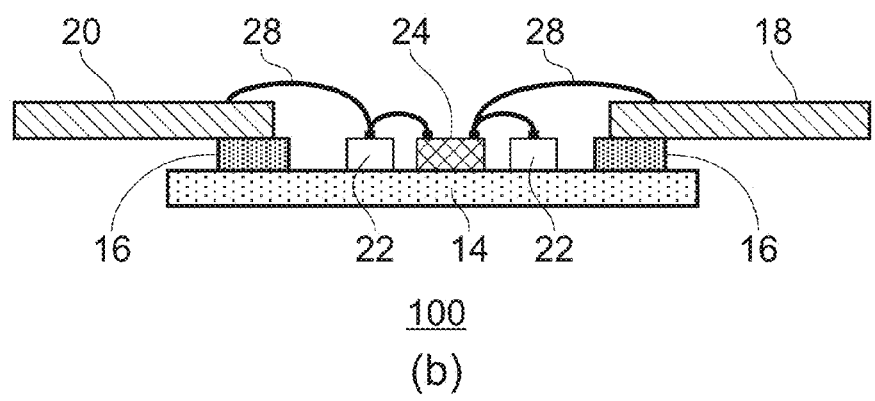
Figure 2:
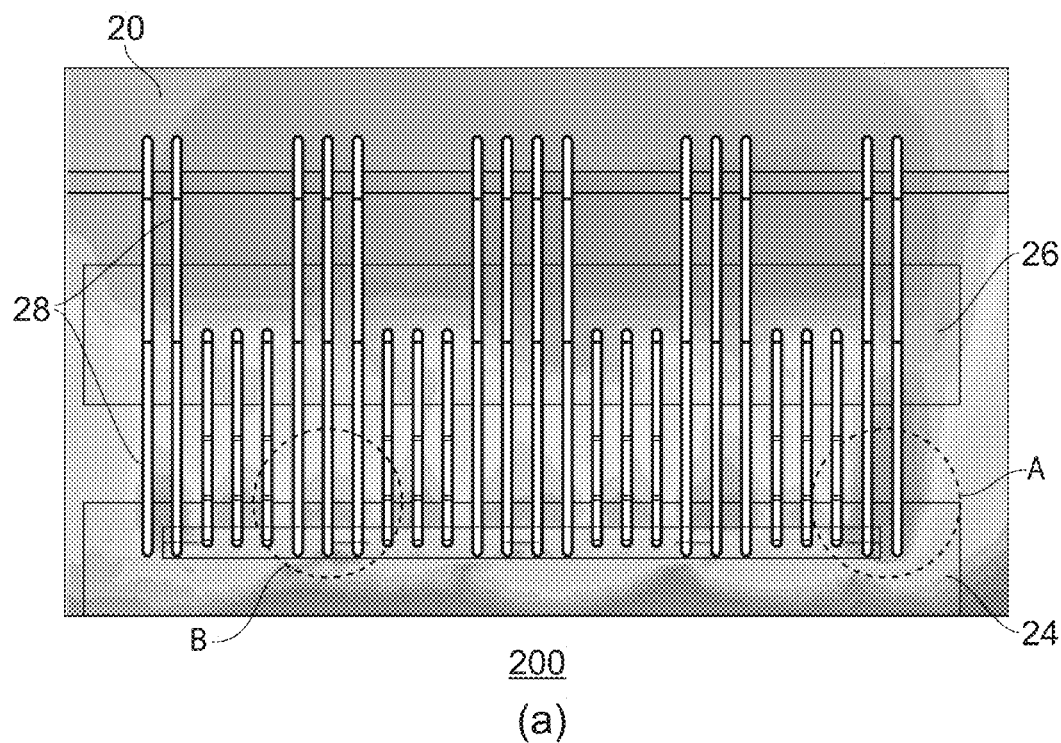
FIG. 2 shows a) the current distribution along the edge of an active die and b) the impedance variation for the RF power device of FIG. 1.
Figure 2:
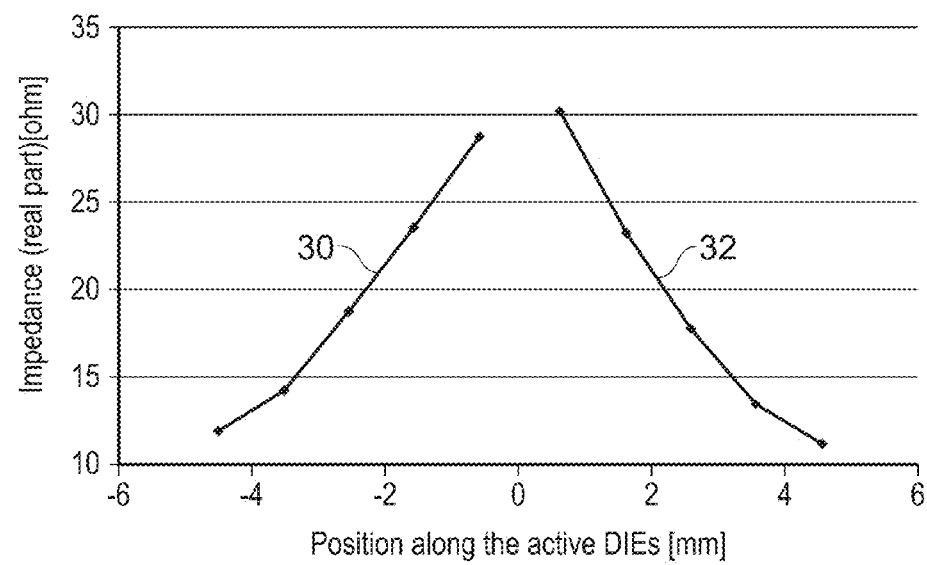
Figure 3:
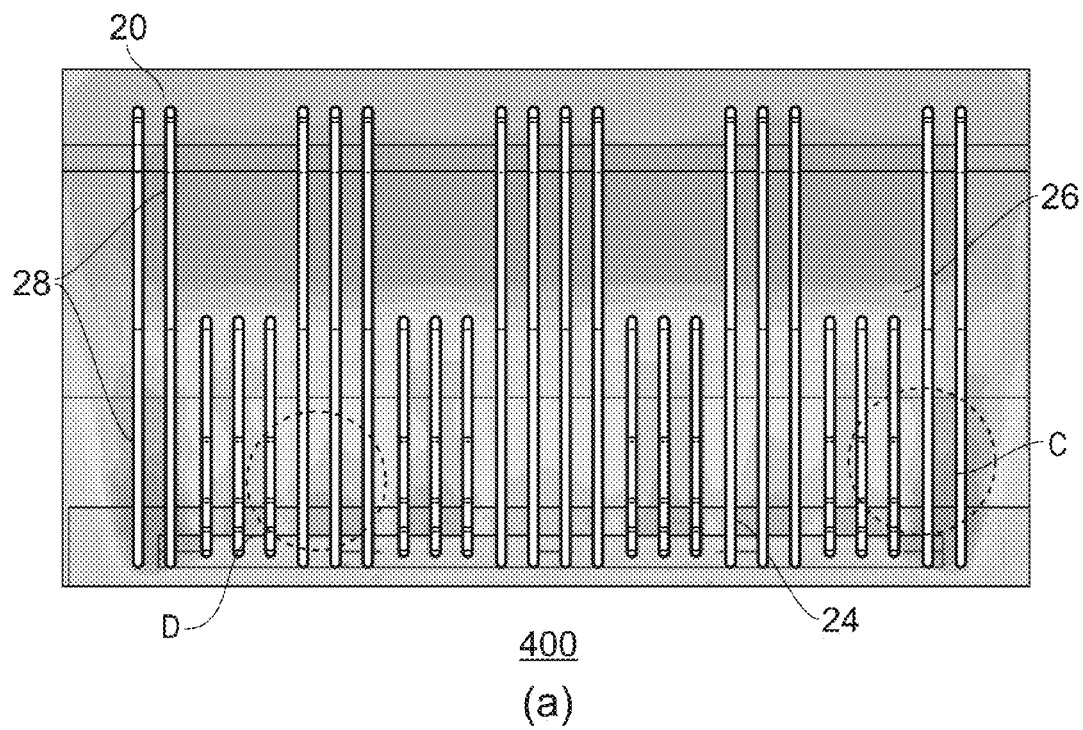
FIG. 3 shows a) the current distribution along the edge of an active die and b) the impedance variation for a known RF power device with a single active die.
Figure 4:
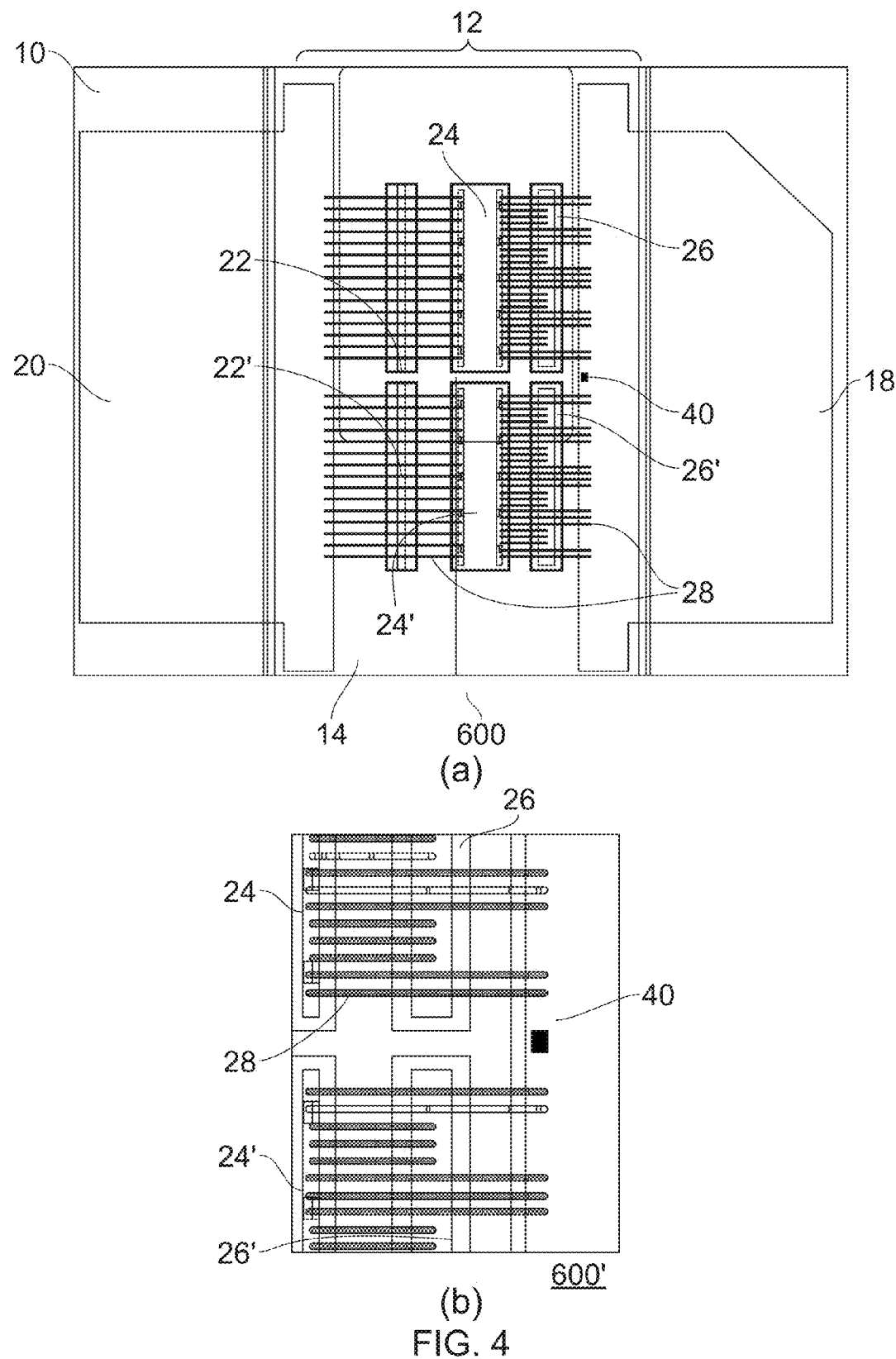
FIG. 4 shows a) a RF power device in plan view and b) an expanded portion of RF power device in plan according to an embodiment.

FIG. 4 shows RF power device 600 in plan view in FIG. 4a mounted on a printed circuit board 10 with a recessed portion 12. FIG. 4b shows an expanded portion of the RF power device 600 in plan view. A conductive substrate layer may form a flange 14. During the packaging process an insulating ring frame 16 may be fixed on top of the flange 14. An input lead 20 and an output lead 18 may be positioned partially on the ring frame 16. An active die 24 which contains at least one power transistor and a second active die 24' which is identical to the first active die 24 may be positioned on the flange 14 between the input lead 20 and the output lead 18. An input matching capacitor 22 and the second input matching capacitor 22' may be positioned on the flange 14 between the input lead and the first active die 24 and the second active die 24'. An output matching passive die 26 and a second output matching passive die 26' may be positioned on the flange between the active dies 24, 24' and the output lead 18. The input and output matching passive dies and bond-wires may form impedance networks or matching networks which may match the respective input and output impedances of the active dies to improve the overall performance of the RF power device. The power transistors on the active dies may be connected up in parallel to effectively form one large transistor. The input lead 20 may be connected to the gates of the power transistors present on the active die 24 and the second active die 24' by bond-wires 28. The output lead 18 may be connected to the drains of the power transistors present on the active die 24 and the second active die 24'. The sources of the power transistors present on the active die 24 and the second active die 24' may be connected to the flange 14. A first electrode of input matching capacitor 22 may be connected to the input lead 20 by bond-wires 28. A second electrode of input matching capacitor 22 may be connected to the flange 14. A first electrode of output matching capacitor 26 may be connected to the drains of RF power transistors on active die 24 by bond-wires 28. A second electrode of output matching capacitor 26 may be connected to flange 14. A lumped capacitor 40 may be formed on a portion of the output lead 18. The lumped capacitor 40 may be positioned on a portion of the lead between the bond-wires connected the first active die 24 and the bond-wires connected to the second active die 24'.

Figure 5:
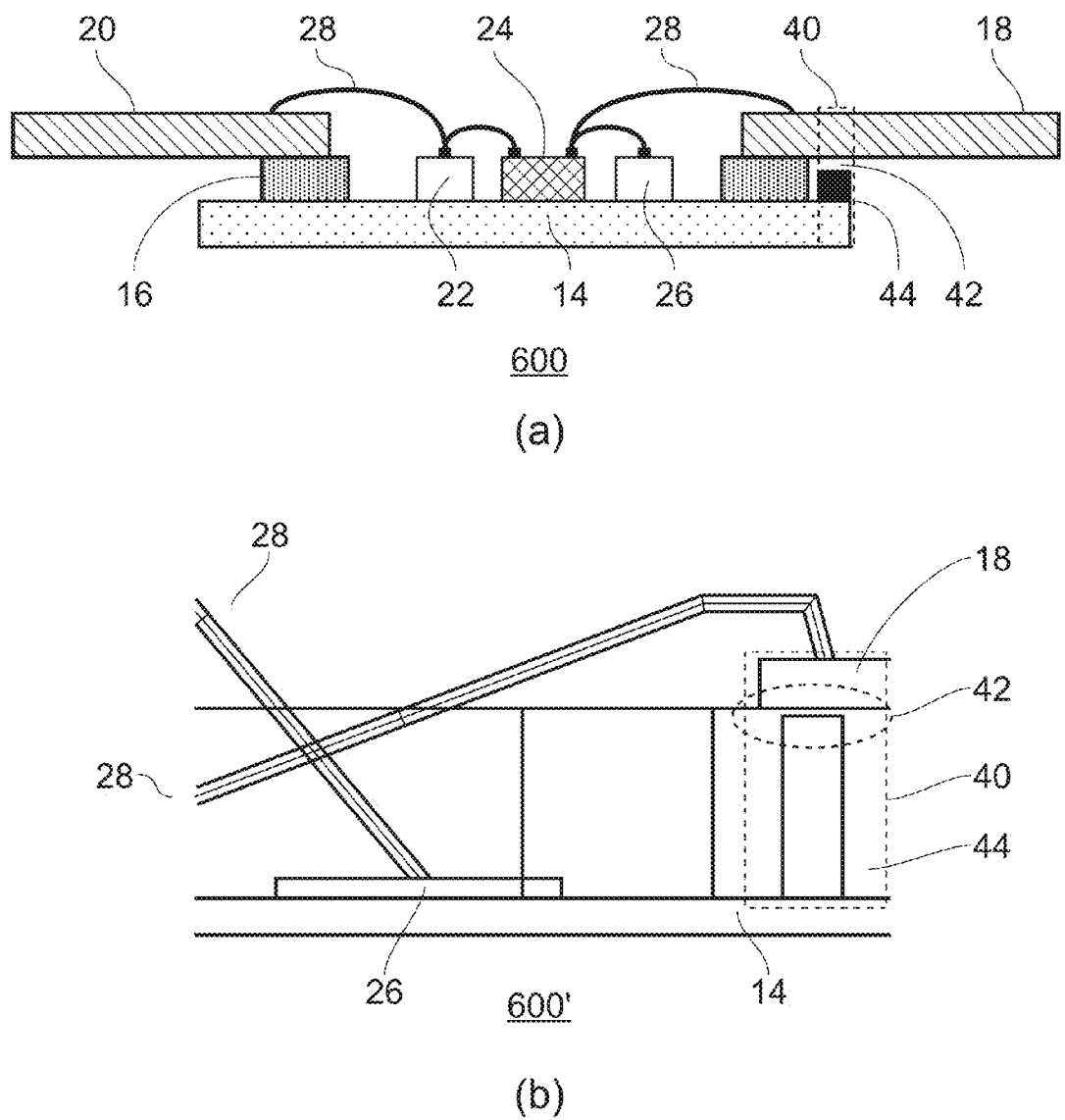
FIG. 5 shows a) the RF device of FIG. 4 in cross-section b) an expanded portion of RF device in cross-section according to an embodiment.

FIG. 5a shows a cross section of RF power device 600 shown in FIG. 4a. FIG. 5b shows an expanded portion 600' of RF power device 600 illustrated in FIG. 5a. Capacitance element 40 may have a first electrode formed from a portion of the flange 14 and a metal rod 44 connected to the flange 14 and extending vertically towards the underside of the output lead 18. The metal rod 44 (or pillar) does not make contact with the surface of the output lead 18, as there is a small capacitive gap 42 which forms the dielectric in the capacitor 40. The portion of the output lead 18 above the metal rod effectively forms the second electrode of the capacitor 40. The length and the cross-sectional area of the rod 44 may be selected according to the required capacitance value. This allows the value to be tuned for a particular RF power device having different numbers of active die and matching capacitor elements.

The cross-sectional area of the rod 44 may typically be approximately 1 mm$^2$ or less. The local capacitance value of the capacitive element 40 may be a fraction of a picofarad to several picofarads. One or more metal rods may be used to form a lumped capacitance with portions of the output lead 18. Similar capacitive elements may be formed from portions of the input lead 20.

Figure 6:
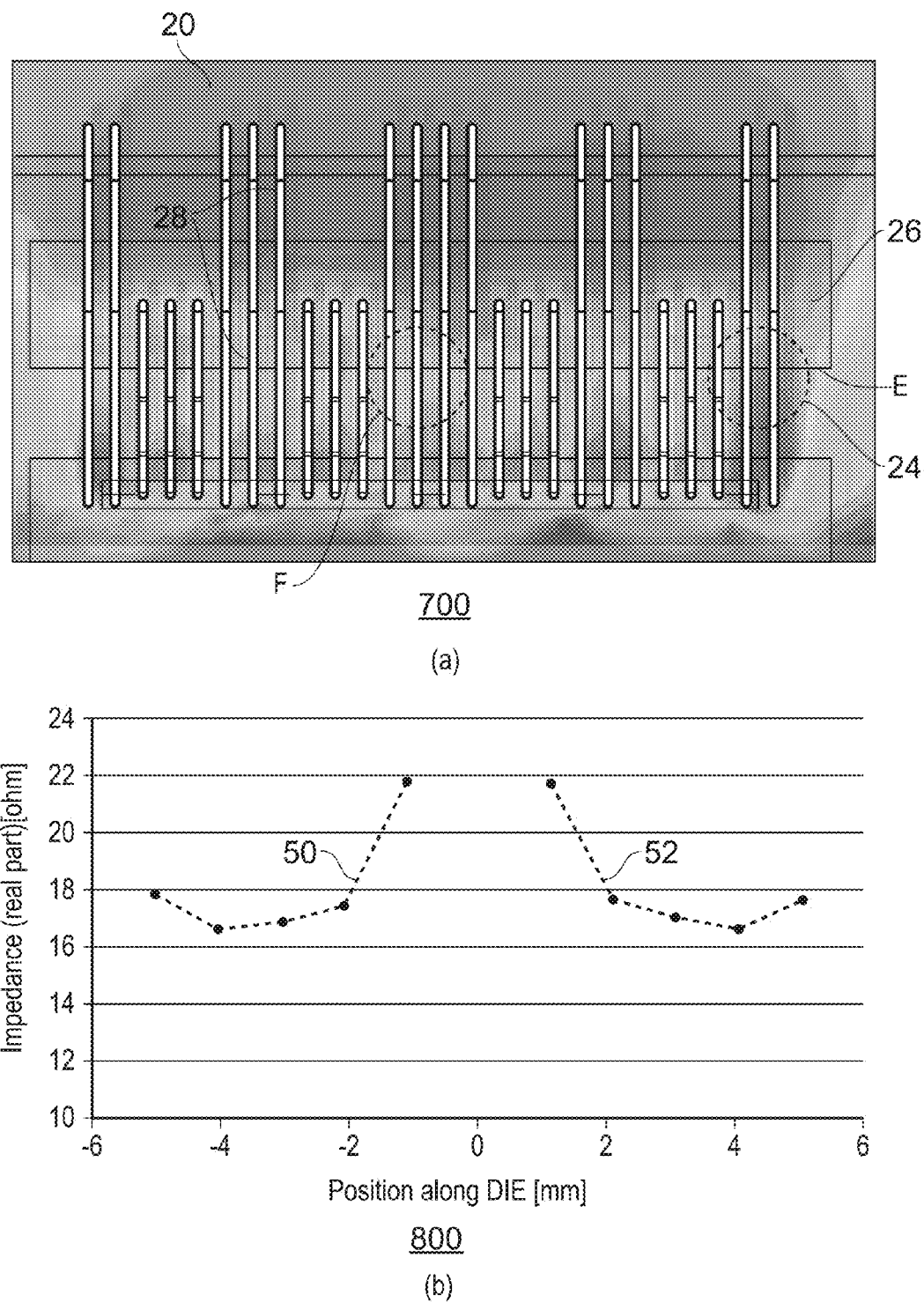
FIG. 6 illustrates a) the current distribution along the edge of an active die and b) the impedance variation for the RF power device of FIGS. 4 and 5.

FIG. 6 shows the current distribution 700 of the first active die 24, the first output capacitor 26 and a portion of the output lead 18 of the embodiment of FIG. 4. With reference to point E and point F along the edge of the active die 24, the current distribution has been modified compared to the known device 100 and the current distribution is much more even or symmetrical along the edge of the active die 24. The current distribution along the output edge of active die 24' may also be similarly improved. FIG. 6b shows a graph 800 of the impedance variation compared to the position along the edge of the active die in the RF power device 400. Graph line 50 shows the variation for first active die 24 and graph line 52 shows the variation for second active die 24'. The effect of the lumped capacitor 40 can be seen as resulting less variation of impedance along the edge of the active die.

RF power devices may have more than one lumped capacitor to improve the current distribution along the edges of the active dies. A lumped capacitor may also be connected or formed on the input lead to similarly improve the current distribution along the opposite edge of the active dies 24, 24'.

Figure 7:
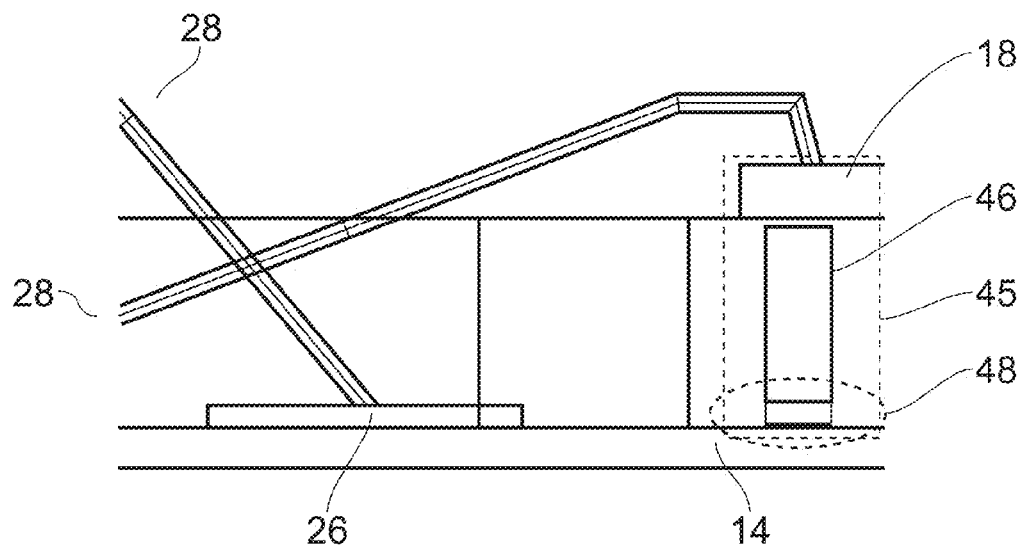
FIG. 7 illustrates a RF power device according to an embodiment.

FIG. 7 shows a RF power device 900 which is similar to RF power device 600 but has a different implementation of the lumped capacitance element. Capacitive element 45 is positioned similarly to capacitive element 40 in FIG. 4. However, in this case, capacitor element 45 has a first electrode formed by a portion of output lead 18 and a conductive rod 46 extending towards the flange 14. The dielectric layer 48 of the capacitor is formed by the gap between the conductive rod and the flange 14. A portion of the flange 14 forms the second electrode of the capacitor. The conductive rod 46 may be formed as part of the shape of the lead 18 during manufacture and then bent towards the flange 14 during RF device packaging. Alternatively a portion of the lead may be deformed so that a portion of the surface of the lead is closer to the flange 14. Alternatively, the conductive rod 46 may be a separate element fixed to the lead.

Figure 8:
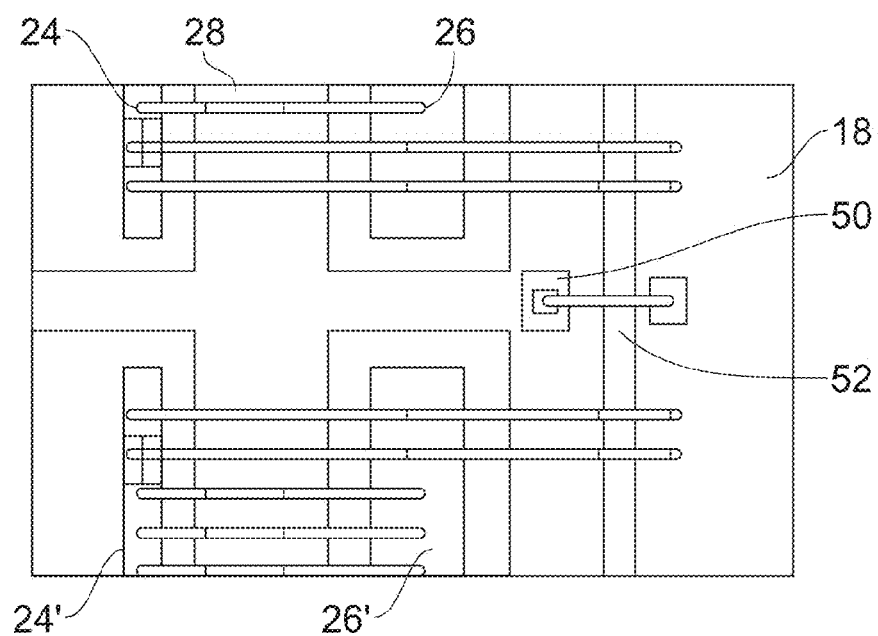
FIG. 8 illustrates a RF power device according to an embodiment.

FIG. 8 shows an RF power device 1000. In this embodiment the capacitance element 50 may be implemented by a discrete MOS capacitor having a first electrode connected to the output lead 18 by a bond wire 28, and the second electrode connected to the flange 14. The capacitive element 50 may be positioned on an axis between first active die 24 and second active die 24'.

Figure 9:
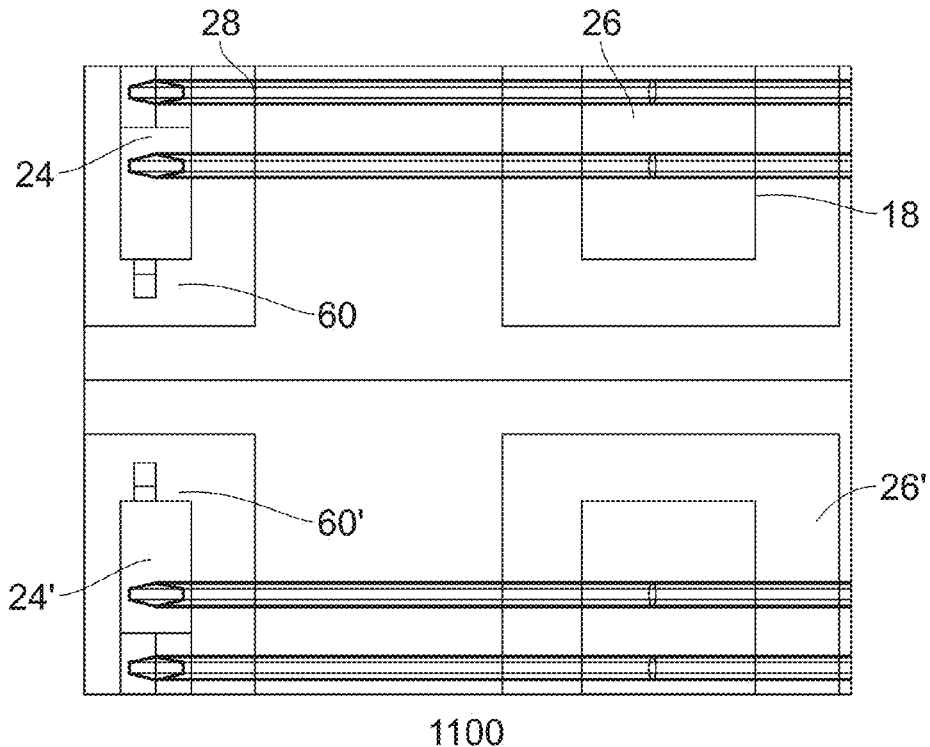
FIG. 9 shows a RF power device according to an embodiment.

FIG. 9 illustrates RF power device 1100. This is similar to the embodiment of FIG. 4 but with the passive output die 26 replaced by an output die 60 includes a matching capacitor and a lumped capacitor 62. Similarly the second passive output die 26' is replaced by second output die 60' including an output matching capacitor and a lumped capacitor 62'. The lumped capacitance may be positioned at an edge the passive output die. The lumped capacitance 62 results in an asymmetric impedance profile when combined with the matched capacitor. The lumped capacitance 62 may be connected to an input lead or an output lead by a bond wire or other conductive connection known to the skilled person.

Alternatively or in addition, the input passive dies may have a lumped capacitance element in addition to the matching capacitance.

Figure 10:
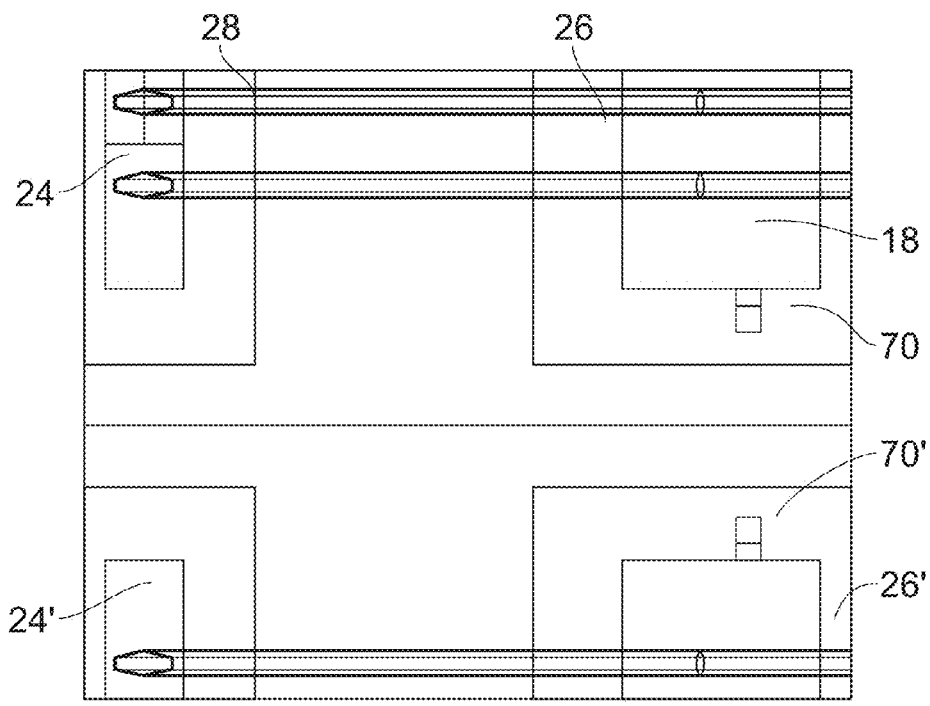
FIG. 10 illustrates a RF power device according to an embodiment.

FIG. 10 illustrates a RF power device 1200. This is similar to the embodiment of FIG. 4 but with the active die 24 replaced with an active die 70 which includes an RF power transistor and a lumped capacitor 72. Similarly the second active die 24' is replaced with a second active die 70' including an RF power transistor and a lumped capacitor 72'. The lumped capacitance 72' may be positioned at an edge the active die 24'.

Figure 11:
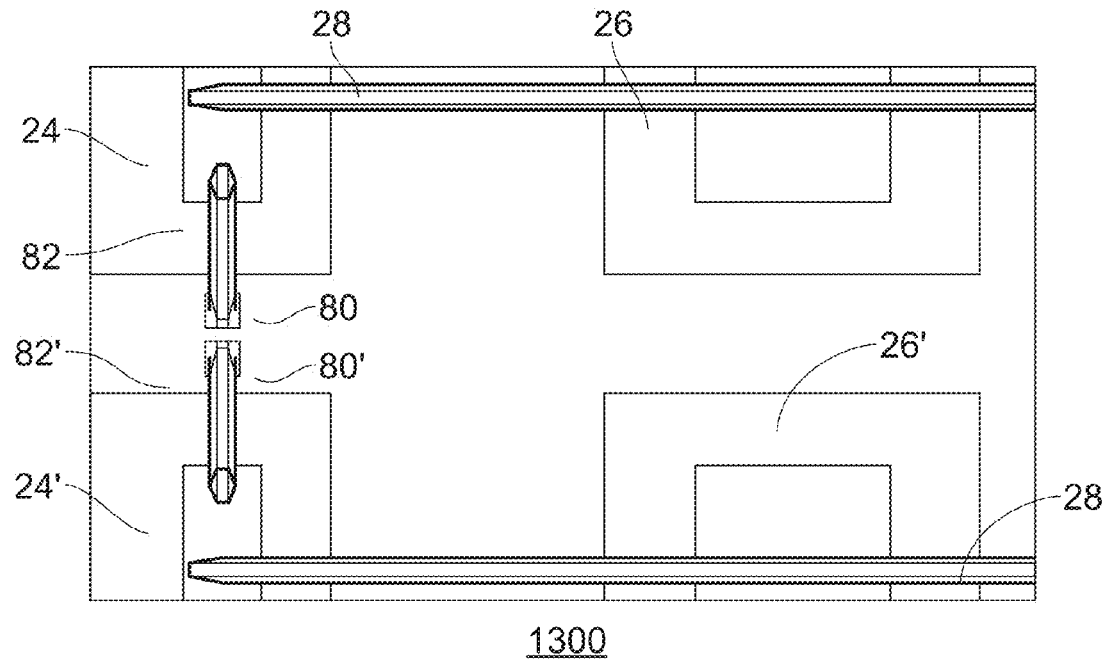
FIG. 11 shows a RF power device according to an embodiment.

FIG. 11 shows an RF power device 1400. In this embodiment a first capacitance element 80 may be implemented by a discrete MOS capacitor having a first electrode connected to the input lead 20 via passive input die 22 using bond-wires, and a second electrode connected to the flange 14. A second capacitance element 80' may be implemented by a discrete MOS capacitor having a first electrode connected to the input lead 18 via passive input die 22' using bond-wires, and a second electrode connected to the flange 14. First capacitive element 80 and second capacitive element 80' may be positioned between the first input passive die 22 and the second input passive die 22'. This arrangement modifies the current distribution in operation along the input side of the active dies 24, 24'.

Alternatively or in addition, MOS capacitors may be similarly connected to the output lead 18 via the output passive dies as will be apparent to the skilled person.

Figure 12:
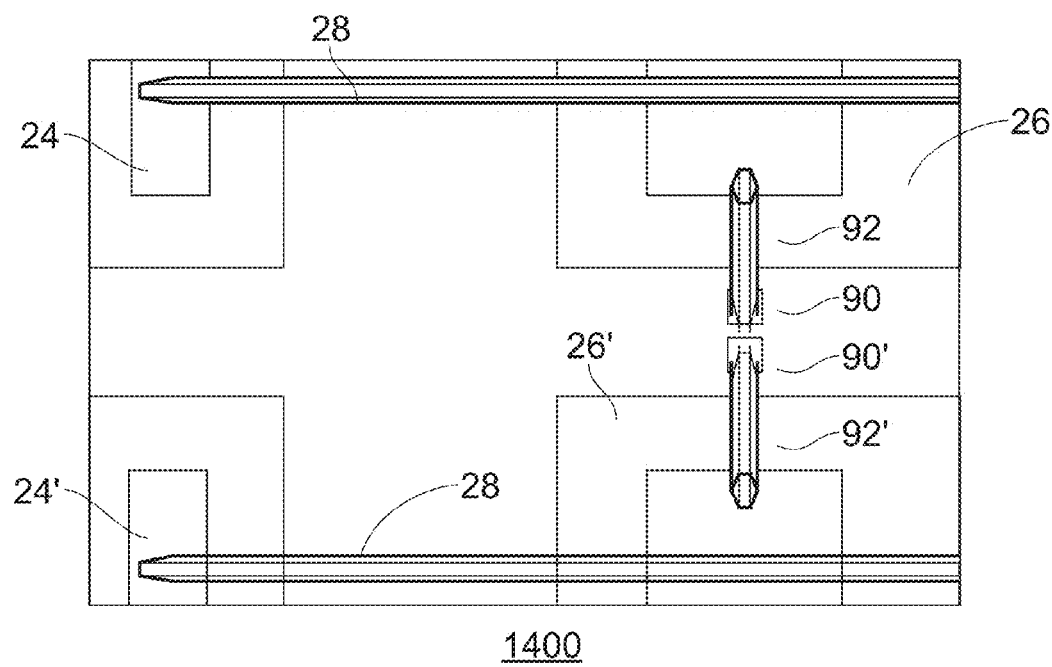
FIG. 12 shows a RF power device according to an embodiment.

FIG. 12 shows an RF power device 1400. In this embodiment a first capacitance element 90 may be implemented by a discrete MOS capacitor having a first electrode connected to the output lead 18 via passive output die 26 using bond-wires, and a second electrode connected to the flange 14. A second capacitance element 90' may be implemented by a discrete MOS capacitor having a first electrode connected to the output lead 18 via passive output die 26' using bond-wires, and a second electrode connected to the flange 14. First capacitive element 90 and second capacitive element 90' may be positioned between the first active die 24 and the second active die 24'. This arrangement modifies the current distribution in operation along the output side of the active dies 24, 24'.

Although the appended claims are directed to particular combinations of features, it should be understood that the scope of the disclosure of the present invention also includes any novel feature or any novel combination of features disclosed herein either explicitly or implicitly or any generalization thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable sub combination.

The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfill the functions of several means recited in the claims and reference signs in the claims shall not be construed as limiting the scope of the claims.

The invention claimed is:

1. A RF power device for amplifying RF signals comprising:
   a flange,
   an input lead,
   an output lead,
   an input matching network comprising an input matching die having a first terminal coupled to the input lead by a plurality of bond-wires and a second terminal coupled to the flange,
   an active die mounted on the flange, the active die comprising at least one power transistor, at least one input terminal and at least one output terminal respectively coupled to the input lead and the output lead by a plurality of bond-wires
   an output matching network comprising an output matching die having a first terminal coupled to the at least one output terminal by a plurality of bond-wires and a second terminal coupled to the flange, and
   at least one capacitance element connected to one of the input lead and the output lead and wherein in operation the at least one capacitance element modifies the impedance of a portion of the respective one of the input lead and the output lead, wherein the input lead and the output lead at least partially overlap the flange and the at least one capacitance element comprises a conductive pillar partially spanning a gap between the flange and a surface of one of the input lead and the output lead.

2. The RF power device according to claim 1 wherein the conductive pillar is in contact with one of the input lead and the output lead.

3. The RF power device according to claim 1 wherein the conductive pillar is formed from a part of one of the input lead and the output lead.

4. The RF power device according to claim 1 wherein the conductive pillar is in contact with the flange and extends towards a surface of the input lead and the output lead.

5. The RF power device of claim 1 wherein the at least one capacitive element comprises a discrete MOS capacitor.

6. The RF power device of claim 5 wherein the discrete MOS capacitor is connected to one of the input lead and the output lead by a single bond wire.

7. The RF power device of claim 5 wherein the discrete MOS capacitor is connected to the input lead by a first bond wire between the discrete MOS capacitor and input matching die and a second bond wire between the input matching die and the input lead.

8. The RF power device of claim 5 wherein the discrete MOS capacitor is connected to the output lead by a first bond wire between the discrete MOS capacitor and output matching die and a second bond wire between the output matching die and the output lead.

9. The RF power device of claim 1 wherein the at least one capacitive element is formed on the input matching die.

10. The RF power device of claim 1 wherein the at least one capacitive element is formed on the output matching die.

11. The RF power device of claim 1 wherein the at least one capacitive element is formed on the active die.

12. The RF power device of claim 1 comprising:
   a further input matching network comprising a further input matching die having a first terminal coupled to the input lead by a plurality of bond-wires and a second terminal coupled to the flange,
   a further active die mounted on the flange, the further active die comprising at least one power transistor, at least one input terminal and at least one output terminal respectively coupled to the input lead and the output lead by a plurality of bond-wires;
   a further output matching network comprising a further output matching die having a first terminal coupled to the at least one output terminal by a plurality of bond-wires and a second terminal coupled to the flange,
   wherein the at least one capacitance element modifies the current distribution along an edge of the active die and the further active die.

13. An RF amplifier comprising the RF power device of claim 1.

14. A base station comprising the RF power amplifier of claim 13.

* * * * *